(12) United States Patent
Chang

(10) Patent No.: US 7,523,369 B2
(45) Date of Patent: Apr. 21, 2009

(54) SUBSTRATE AND TESTING METHOD THEREOF

(75) Inventor: Chih-Chung Chang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 426 days.

(21) Appl. No.: 11/502,405

(22) Filed: Aug. 11, 2006

(65) Prior Publication Data
US 2007/0061643 A1 Mar. 15, 2007

(30) Foreign Application Priority Data
Aug. 17, 2005 (TW) .............................. 94128060 A

(51) Int. Cl.
*G01R 31/28* (2006.01)
(52) U.S. Cl. ........................ 714/724; 324/754
(58) Field of Classification Search ................ 257/781, 257/700, 724, 738, 48; 324/755, 754; 724/724
See application file for complete search history.

(56) References Cited

U.S. PATENT DOCUMENTS

| | | | |
|---|---|---|---|
| 6,429,532 B1 * | 8/2002 | Han et al. .................... 257/781 |
| 6,861,858 B2 * | 3/2005 | Chen et al. .................. 324/755 |
| 6,876,216 B2 * | 4/2005 | Fu-Chin ...................... 324/758 |
| 2003/0025191 A1 * | 2/2003 | Takeoka et al. ............. 257/700 |
| 2003/0085463 A1 * | 5/2003 | Gerber et al. ............... 257/724 |
| 2003/0122255 A1 * | 7/2003 | Fang ........................... 257/738 |
| 2006/0091384 A1 * | 5/2006 | Ho et al. ........................ 257/48 |
| 2007/0126443 A1 * | 6/2007 | Grube et al. ................ 324/754 |

\* cited by examiner

*Primary Examiner*—David Ton
(74) *Attorney, Agent, or Firm*—Volentine & Whitt, P.L.L.C.

(57) ABSTRACT

The present invention relates to a substrate and testing method thereof. The method of the invention comprises: (a) providing a substrate, the substrate having a first surface and a second surface, the first surface having a plurality of first testing pads and the second surface having a plurality of second testing pads; (b) forming a conductive material on the first surface to electrically connect at least two first testing pads; and (c) testing the substrate by utilizing a testing fixture, the testing fixture having at least one first testing probe unit and at least one second testing probe unit. Whereby, the first testing probe unit and the second testing probe unit can easily measure the electrical characteristics of the substrate, and the testing process and testing time can be reduced.

16 Claims, 7 Drawing Sheets

SUBSTRATE AND TESTING METHOD THEREOF

BACKGROUND OF THE INVENTION

1. Field of the Invention

The invention relates to a substrate and a testing method thereof, particularly to a substrate of electrically connecting testing pads and a testing method thereof.

2. Description of the Related Art

FIG. 1 shows a conventional testing method for a substrate. Firstly, a substrate 10 is provided. The substrate 10 has a first surface 101 and a second surface 102. The first surface 101 is a chip side for attaching a chip, and the second surface 102 is a solder ball side. The first surface 101 has a plurality of first testing pads 103 and the second surface 102 has a plurality of second testing pads 104. The size of the first testing pad 103 is usually smaller than that of the second testing pad 104. The first testing pads 103 electrically connect to the second testing pads 104 to form a plurality of circuits 105. A testing fixture 11 is used for testing the substrate 10. The testing fixture 11 has a first testing probe unit 12 and a plurality of second testing probe unit 13. The first testing probe unit 12 has two first testing probes 121, 122, and each second testing probe unit 13 has two second testing probes 131, 132. The first testing probe unit 12 electrically connects to the first testing pad 103, and each second testing probe unit 13 electrically connects to the second testing pad 104.

In the conventional testing method, the first testing pads 103 must be tested one by one, and the first testing probes 121, 122 must contact with the same first testing pad 103. However, the size of the first testing pad 103 is very small, especially for four-wire test probe, so that it is difficult to dispose the first testing probes 121, 122 on the same first testing pad 103. Therefore, some of the first testing pads 103 may be missed for testing, and it will takes very long time to test the substrate 10.

Consequently, there is an existing need for providing a substrate and a testing method thereof to solve the above-mentioned problems.

SUMMARY OF THE INVENTION

One objective of the present invention is to provide a testing method for a substrate. The testing method comprises the steps of: (a) providing a substrate, the substrate having a first surface and a second surface, the first surface having a plurality of first testing pads and the second surface having a plurality of second testing pads; (b) forming a first conductive material on the first surface to electrically connect at least two first testing pads; and (c) testing the substrate by utilizing a testing fixture, the testing fixture having at least one first testing probe unit and at least one second testing probe unit.

Another objective of the present invention is to provide a substrate. The substrate comprises a first surface, a second surface and a first conductive material. The first surface has a plurality of first testing pads. The second surface has a plurality of second testing pads. The first testing pads electrically connect to the second testing pads to form a plurality of circuits. The first conductive material is formed on the first surface and electrically connects at least two first testing pads.

The testing method and the substrate of the present invention utilize the first conductive material to electrically connect the first testing pads on the first surface, so that the first testing probe unit and the second testing probe unit can easily measure the electrical characteristics of the substrate. Therefore, the testing process and testing time can be reduced, and whether the substrate is good or not can be easily recognized.

DETAILED DESCRIPTION OF THE INVENTION

Figure 1:
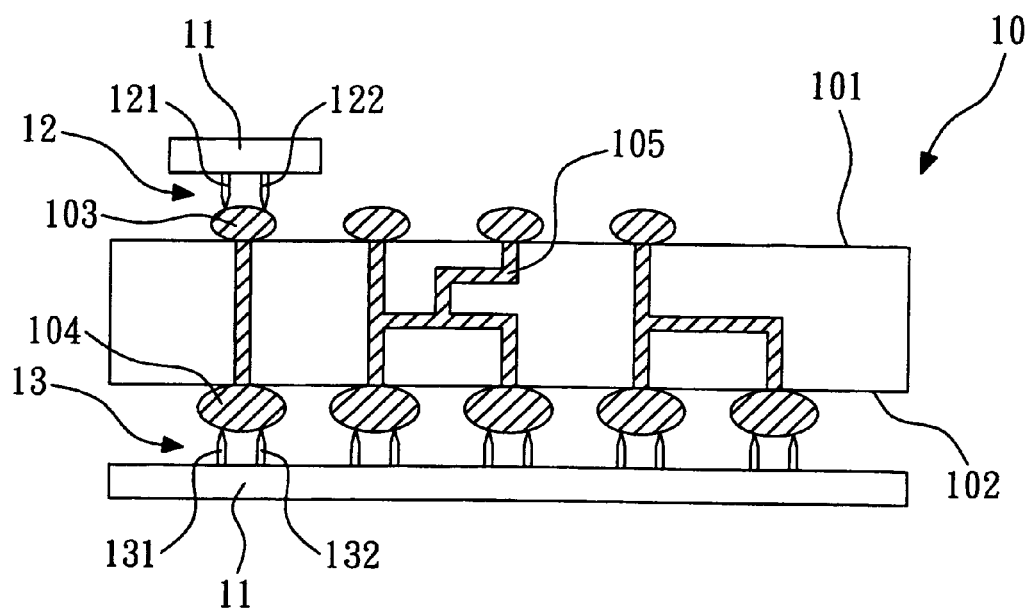
FIG. 1 shows a conventional testing method for a substrate.
Figure 2:
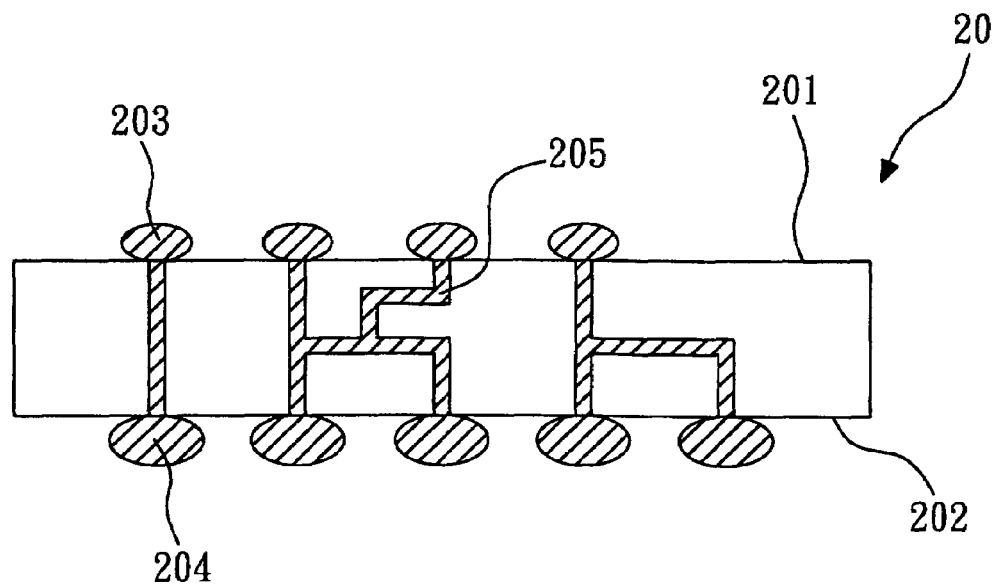
FIGS. 2 to 4A-B show a testing method for a substrate according to a first embodiment of the present invention.
Figure 3:
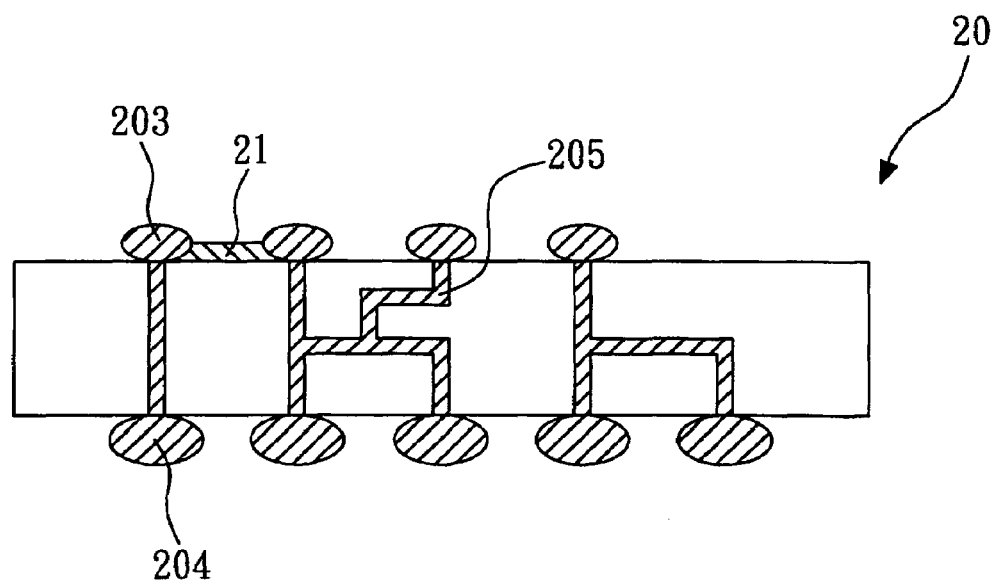

FIGS. 2 to 4 show a testing method for a substrate according to a first embodiment of the present invention. Referring to FIG. 2, firstly, a substrate 20 is provided. The substrate 20 has a first surface 201 and a second surface 202. In the embodiment, for example, the first surface 201 is a chip side for attaching a chip, and the second surface 202 is a solder ball side. The first surface 201 has a plurality of first testing pads 203 and the second surface 202 has a plurality of second testing pads 204. The size of the first testing pad 203 for attaching chip is usually smaller than that of the second testing pad 204. The first testing pads 203 electrically connect to the second testing pads 204 to form a plurality of circuits 205. Referring to FIG. 3, a first conductive material 21 is used for connecting two of the first testing pads 203 on the first surface 201. The first conductive material 21 is line-shaped and electrically connects at least two first testing pads 203.

Figure 4A:
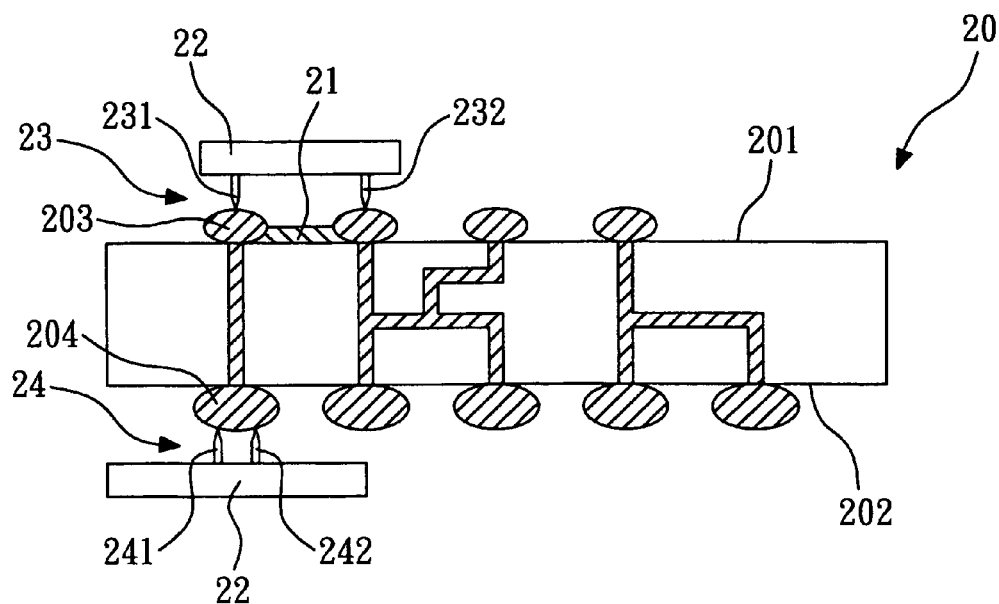

Referring to FIG. 4A, a testing fixture 22 is used for testing the substrate 20. The testing fixture 22 comprises at least one first testing probe unit 23 and at least one second testing probe unit 24. In the embodiment, the first testing probe unit 23 has two first testing probes 231, 232, and the second testing probe unit 24 has two second testing probes 241, 242. The first testing probe unit 23 electrically connects the first testing pad 203 and the second testing probe unit 24 electrically connect to the second testing pads 204 so as to measure the electrical characteristics of the substrate 20. In the embodiment, the distance between the first testing probes 231, 232 must be adjusted according to the distance between two of the first testing pads 203.

The testing method according to the first embodiment utilizes the first conductive material 21 to electrically connect the first testing pads 203 on the first surface 201, so that the first testing probes 231, 232 of the first testing probe unit 23 can easily electrically connect to the first testing pads 203. Also, the electrical characteristics of the substrate 20 can be easily measured, the testing process and testing time can be reduced, and that the substrate 20 is good or not can be easily recognized. It should be noted that in other embodiment a second conductive material may be formed on the second surface 202, and electrically connect at least two second testing pads 204 on the second surface 202.

Figure 4B:
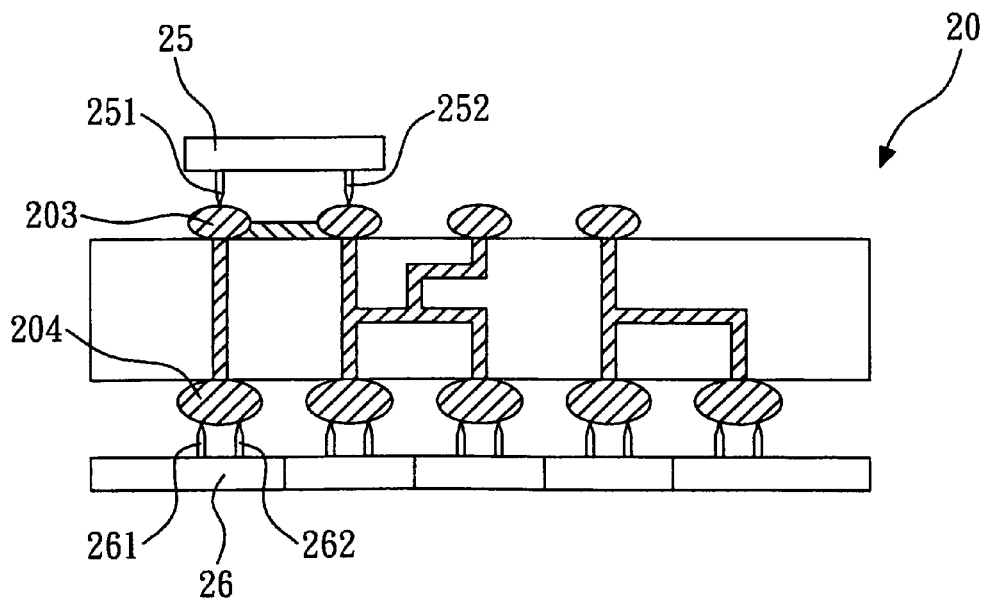

In addition, referring to FIG. 4B, the testing fixture may comprise a first testing probe unit 25 and a plurality of second testing probe units 26. In the embodiment, the first testing probe unit 25 has two first testing probes 251, 252, and each second testing probe unit 26 has two second testing probes 261, 262. By utilizing the first testing probe unit 25 and the second testing probe units 26 to electrically connect to the first testing pads 203 and the second testing pads 204 respectively, the electrical characteristics of the substrate 20 can be easily measured, the testing process and testing time can be reduced, and that the substrate 20 is good or not can be easily recognized.

Figure 5A:
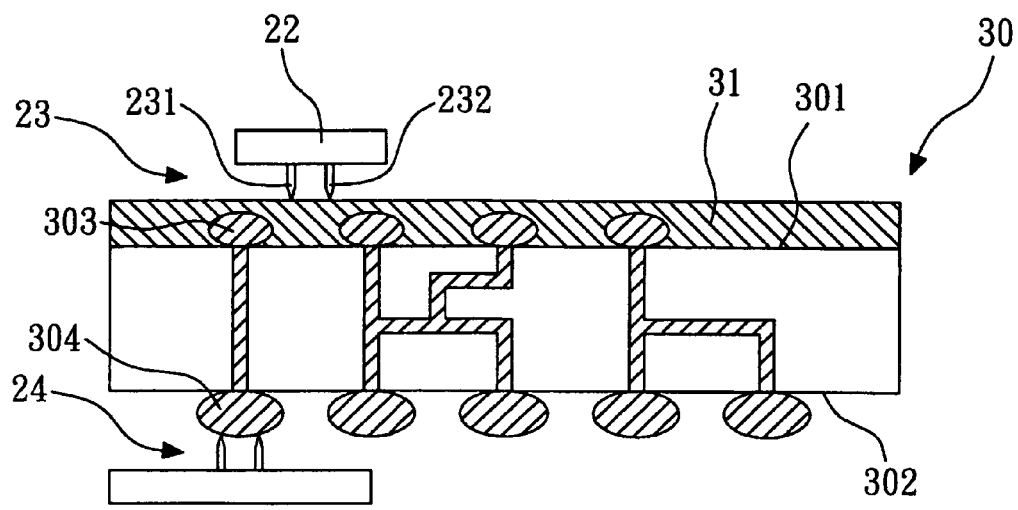
FIG. 5A-B show a testing method for a substrate according to a second embodiment of the present invention.

FIG. 5A shows a testing method for a substrate according to a second embodiment of the present invention. The difference between the testing method of the first embodiment and the testing method of the second embodiment is that in the latter the first conductive material 31 is formed on the first surface 301 by electroplating and totally covers the first testing pads 303. The first testing probe unit 23 may electrically connect to any portion of the first conductive material 31, and the second testing probe unit 24 electrically connect to the second testing pads 304 so as to measure the electrical characteristics of the substrate 30.

Figure 5B:
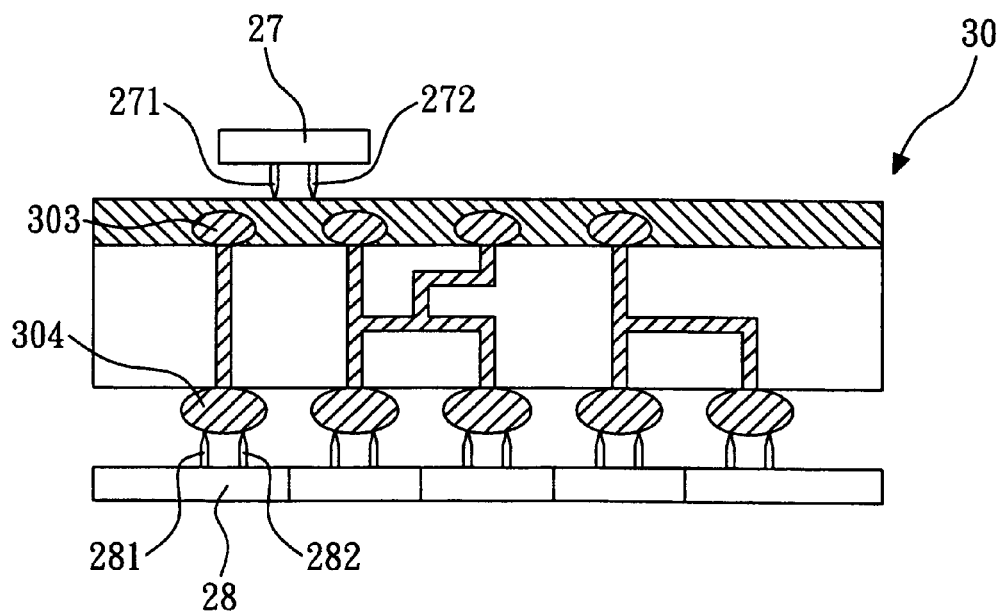

In the testing method of the second embodiment, the conductive material 31 is formed on the first surface 301 by electroplating and totally covers the first testing pads 303 so as to electrically connect all of the first testing pads 303. Therefore, the first testing probe unit 23 may electrically connect to any portion of the first conductive material 31 to measure the electrical characteristics of the substrate 30. Also, the electrical characteristics of the substrate 30 can be easily measured, the testing process and testing time can be reduced, and whether the substrate 30 is good or not can be easily recognized. It should be noted that a second conductive material may be formed on the second surface 302 by electroplating and totally covers the second testing pads 304 so as to electrically connect all of the second testing pads 304. In addition, referring to FIG. 5B, the testing fixture may comprise a first testing probe unit 27 and a plurality of second testing probe units 28. In the embodiment, the first testing probe unit 27 has two first testing probes 271, 272, and each second testing probe unit 28 has two second testing probes 281, 282. By utilizing the first testing probe unit 27 and the second testing probe units 28 to electrically connect to the first testing pads 303 and the second testing pads 304 respectively, the electrical characteristics of the substrate 30 can be easily measured, the testing process and testing time can be reduced, and that the substrate 30 is good or not can be easily recognized.

Figure 6:
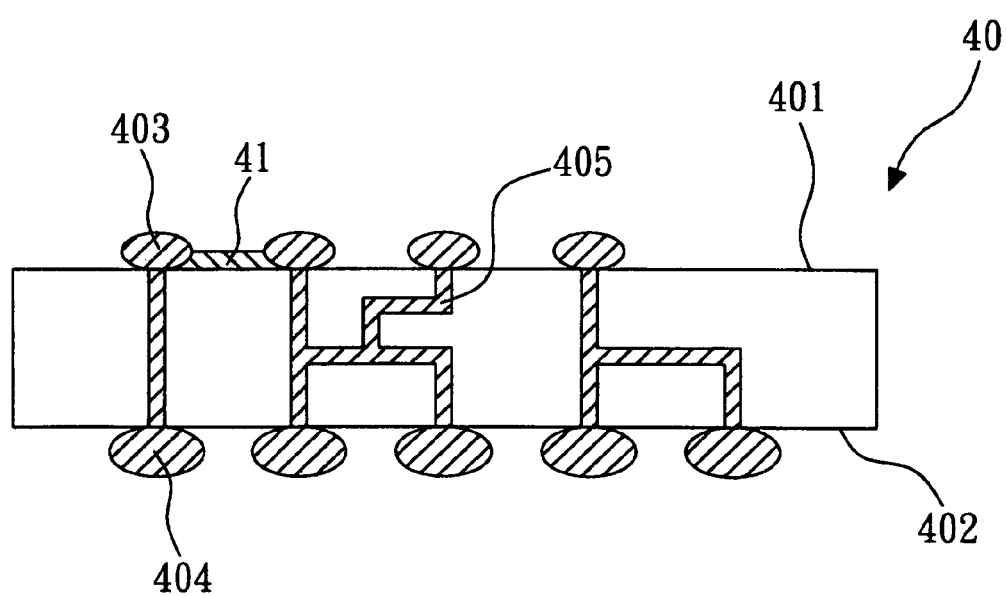
FIG. 6 shows a substrate according to a first embodiment of the present invention.

FIG. 6 shows a substrate according to a first embodiment of the present invention. The substrate 40 comprises a first surface 401 and a second surface 402. The first surface 401 has a plurality of first testing pads 403. The second surface 402 has a plurality of second testing pads 404. The first testing pads 403 electrically connect to the second testing pads 404 to form a plurality of circuits 405. A first conductive material 41 is formed on the first surface 401 and electrically connects two first testing pads 403. It should be noted that in other embodiment a second conductive material may be formed on the second surface 202, and electrically connect at least two second testing pads 404 on the second surface 402. The first conductive material 41 comprises silver glue in this embodiment, for example. The first conductive material 41 is line-shaped and electrically connects at least two first testing pads 403. In other application, the circuits 405 of the substrate 40 can be electrically connected by connecting two first testing pads 403.

Because the first conductive material 41 electrically connects two first testing pads 403 on the first surface 401, the electrical characteristics of the substrate 40 can be easily measured by the testing fixture, the testing process and testing time can be reduced, and whether the substrate 40 is good or not can be easily recognized.

Figure 7A:
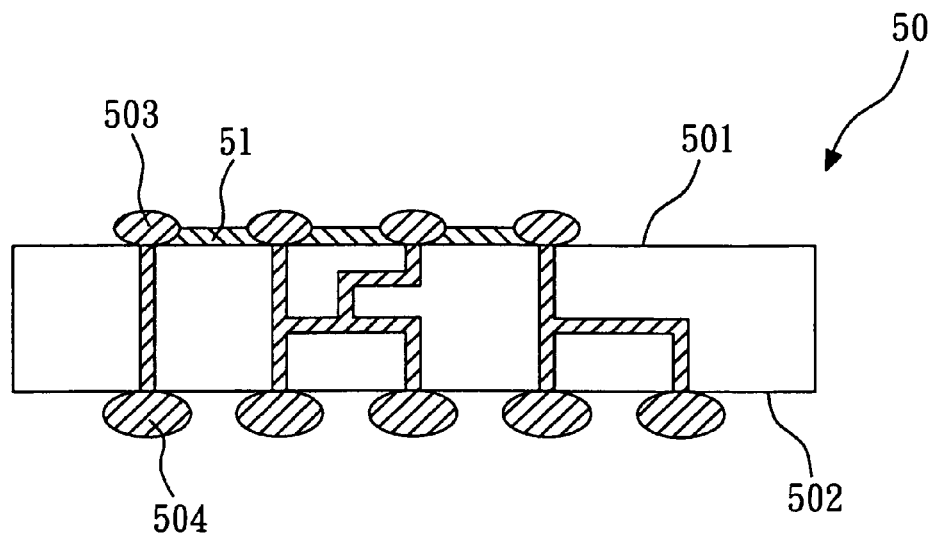
FIG. 7A shows a side view of a substrate according to a second embodiment of the present invention.
Figure 7B:
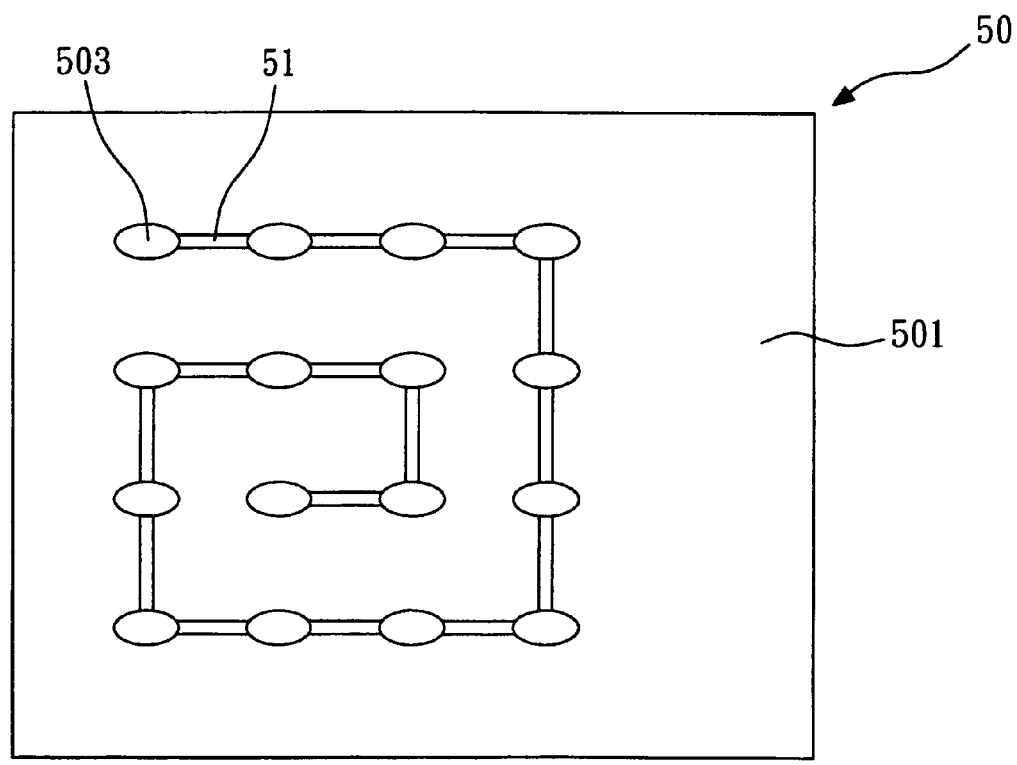
FIG. 7B shows a top view of the substrate according to the second embodiment of the present invention.

FIGS. 7A and 7B show a substrate 50 according to a second embodiment of the present invention. The difference between the substrate 50 of the second embodiment and the substrate 40 of the first embodiment is that a first conductive material 51 is formed on the first surface 501 and electrically connects all of the first testing pads 503. It should be noted that in other embodiment a second conductive material may be formed on the second surface 502 and electrically connects all of the second testing pads 504.

The first conductive material 51 electrically connects all of the first testing pads 503 on the first surface 501 to form a testing surface, so that the electrical characteristics of the substrate 50 can be easily measured by utilizing the testing line, the testing process and testing time can be reduced, and whether the substrate 50 is good or not can be easily recognized.

Figure 8:
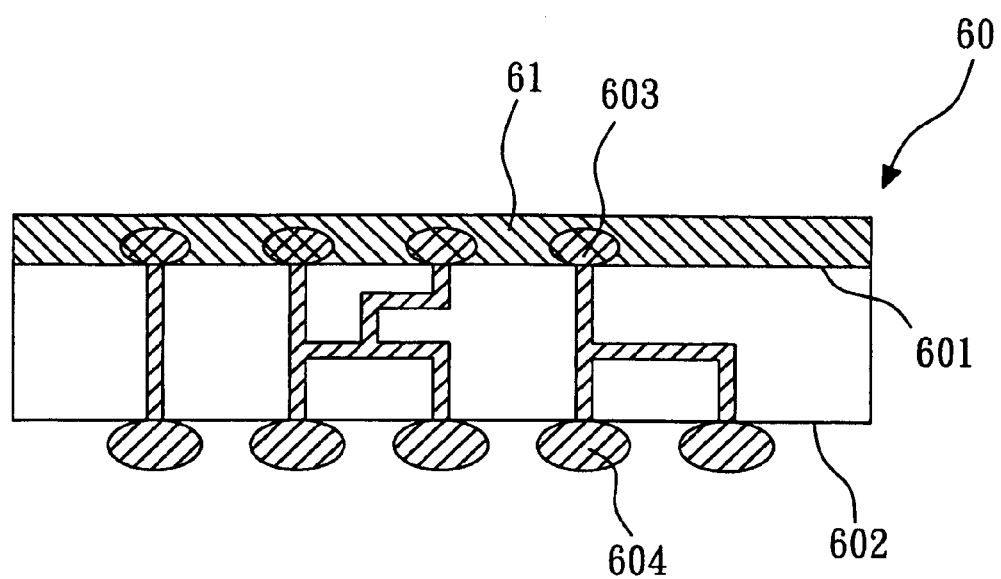
FIG. 8 shows a substrate according to a third embodiment of the present invention.

Referring to FIG. 8, it shows a substrate 60 according to a third embodiment of the present invention. The difference between the substrate 60 of the third embodiment and the substrate 40 of the first embodiment is that a first conductive material 61 is formed on the first surface 601 by electroplating and electrically connects all of the first testing pads 603. It should be noted that in other embodiment a second conductive material may be formed on the second surface 602 by electroplating and electrically connects all of the second testing pads 604. The first conductive material 61 comprises copper in this embodiment, for example.

The first conductive material 61 covers the first surface 601 and electrically connects all of the first testing pads 603 so as to form a testing surface, so that the electrical characteristics of the substrate 60 can be easily measured by utilizing the testing surface, the testing process and testing time can be reduced, and whether the substrate 60 is good or not can be easily recognized.

While the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A substrate comprising:
 a first surface, having a plurality of first testing pads;
 a second surface, having a plurality of second testing pads, and the first testing pads electrically connecting to the second testing pads to form a plurality of circuits; and
 a first conductive material, formed on the first surface, and electrically connecting at least two first testing pads.

2. The substrate according to claim 1, wherein the first conductive material is line-shaped and electrically connects at least two first testing pads.

3. The substrate according to claim 1, wherein the first conductive material comprises silver glue.

4. The substrate according to claim 1, wherein the first conductive material covers all of the first testing pads.

5. The substrate according to claim 4, wherein the first conductive material comprises copper.

6. The substrate according to claim 1, further comprising a second conductive material, formed on the second surface to electrically connect at least two second testing pads.

7. A testing method for a substrate, the testing method comprising:
  (a) providing a substrate, having a first surface and a second surface, the first surface having a plurality of first testing pads and the second surface having a plurality of second testing pads;
  (b) forming a first conductive material on the first surface to electrically connect at least two first testing pads; and
  (c) testing the substrate by utilizing a testing fixture, the testing fixture having at least one first testing probe unit and at least one second testing probe unit.

8. The testing method according to claim 7, wherein the first testing probe unit has two first testing probes.

9. The testing method according to claim 7, wherein the second testing probe unit has two second testing probes.

10. The testing method according to claim 7, wherein the first conductive material is line-shaped and electrically connects at least two first testing pads in the step (b).

11. The testing method according to claim 10, wherein the first testing probe electrically connects the first testing pads, and the second testing probes electrically connect the second testing pads in the step (c).

12. The testing method according to claim 10, wherein the first conductive material covers the first testing pads on the first surface in the step (b).

13. The testing method according to claim 12, wherein the first conductive material is formed on the first surface by electroplating.

14. The testing method according to claim 12, wherein the first testing probe electrically connects the conductive material, and the second testing probes electrically connect the second testing pads in the step (c).

15. The testing method according to claim 7, further comprising a step of forming a second conductive material on the second surface to electrically connect at least two second testing pads after the step (b).

16. The testing method according to claim 7, wherein the testing fixture has at least one first testing probe unit and a plurality of second testing probe unit.

* * * * *